United States Patent
Cubit

[19]
[11] Patent Number: 6,013,316
[45] Date of Patent: Jan. 11, 2000

[54] DISC MASTER DRYING COVER ASSEMBLY

[75] Inventor: Robert L. Cubit, Westminster, Calif.

[73] Assignee: ODME, Netherlands

[21] Appl. No.: 09/020,254

[22] Filed: Feb. 7, 1998

[51] Int. Cl.[7] ............................. B05D 3/12; B05C 11/00
[52] U.S. Cl. ........................ 427/240; 427/377; 34/56; 437/231; 118/52
[58] Field of Search ................... 427/240, 377; 437/231; 34/58; 118/52

[56] References Cited

U.S. PATENT DOCUMENTS

| | | | |
|---|---|---|---|
| 949,930 | 2/1910 | Hutchins . | |
| 4,350,562 | 9/1982 | Bonil | 156/639 |
| 4,445,281 | 5/1984 | Aigoo | 34/58 |
| 4,637,146 | 1/1987 | Motoki | 34/58 |
| 4,936,940 | 6/1990 | Kawasumi | 156/345 |
| 5,083,381 | 1/1992 | Aigo | 34/8 |
| 5,237,756 | 8/1993 | Hurwitt | 34/15 |
| 5,385,624 | 1/1995 | Amemiya | 156/345 |
| 5,422,139 | 6/1995 | Fischer | 427/248.1 |
| 5,478,401 | 12/1995 | Tsunekawa | 134/1 |
| 5,491,112 | 2/1996 | Buchta | 437/225 |

FOREIGN PATENT DOCUMENTS

| | | |
|---|---|---|
| 62-189735 | 2/1986 | Japan . |
| 63-104426 | 5/1988 | Japan . |

*Primary Examiner*—Janyce Bell
*Attorney, Agent, or Firm*—W. D. English

[57] ABSTRACT

A spin coater drying cover is disclosed having unique properties and construction to enable accurate control of the drying process of an optically active lamina of a Nitrocellulose Dye Polymer solution on a Polycarbonate disc substrate. The cover is configured with an orientation platform allowing micro adjustment of the angle and distance of a porous gas filter disc of the cover in relation to the optically active layer. The filter, essentially parallel and concentric to the disc substrate, can be varied from a flat, concave or convex camber to cause gas flow over the disc substrate to be such that a variable linear ramp of the optically active lamina can be achieved, with a thicker layer at the periphery than at the center of the disc. This enables deeper data pits to be formed at the difficult to mold outer disc periphery, thus increasing yield in a disc mastering process.

20 Claims, 5 Drawing Sheets

DISC MASTER DRYING COVER ASSEMBLY

FIELD OF THE INVENTION

The present invention relates to an apparatus and method for surface treatment of a disc. Particularly, the present invention relates to coating optical discs with an optically active layer.

DESCRIPTION OF THE PRIOR ART

Methods of dispensing layers of material on disc shaped substrates have previously been contemplated in the art. U.S. Pat. No. 4,350,562 to Bond, discloses a wafer supported on a bed of gaseous flow provided from below the wafer and enclosed by sidewalls to prevent the wafer from lateral dispensation. The wafer is then etched from above and cleaned by a spray of water. The free floating wafer suspension is not conducive to the precision required in coating the wafer. Furthermore, the escaping gas from in between the wafer and the sidewalls will produce turbulence, which will negatively interfere with the coating procedure. Moreover, the use of water to rinse the coated wafer may result in a degradation of the coating by unwanted ions contained therein.

U.S. Pat. No. 4,637,146 to Motokl et al., discloses a similar apparatus except that a gaseous flow is provided from a point above the wafer. The disc cover above the water is planar and provides the uniform pressure gas flow there between. The wafer is maintained laterally by connecting stoppers, and after the wafer is coated it is then washed by a water solution. Because of the uniform pressure gas flow, only uniform layers d coating may be applied to the wafer. In addition, the stoppers, which contact and hold the wafer in a stationary position, may interfere with the precision requiring application of the coating. Furthermore, the use of water to rinse the coated wafer may result in a degradation of the coating by unwanted ions contained therein.

U.S. Pat. No. 4,936,940 to Kawasumi et al., and U.S. Pat. No. 5,385,624 to Amemiya et al., disclose a revolving stage on which a wafer is directly seated and maintained. A planar cover located above the wafer allows a uniform gas flow them between, and introduces a reactive gas suitable for removing a layer of a resist or for cleaning a surface. The direct contact of the wafer with the revolving stage may damage the underside of the water and thereby negatively affect the entire process. In addition, the angle of the cover is not adjustable and cannot vary the pressure of the gas emitted along the surface of the wafer in order to achieve a varied thickness of a coating administered thereon.

U.S. Pat. No. 5,478,401 to Tsunekawa et al., and U.S. Pat. No. 5,491,112 to Buchta et al., disclose protrusions, which attach to quintessential portions of a wafer or disc. A planar cover located above the wafer or disc allows a uniform gas flow there between. The attachment of the protrusions to essential portions of the wafer or disc may damage the underside of the wafer and thereby negatively affect the entire process. In addition, the angle of the cover is not adjustable and cannot vary the pressure of the gas emitted along the surface of the wafer in order to achieve a varied thickness of a coating administered thereon.

All of the aforementioned prior art are insufficient in precisely dispensing a coating on a wafer or disc. Therefore, there is a long standing and continuing need for an advance in the art beyond the existing wafer or disc coating devices that is accurate, that is reliable, is simpler in both design and use, is more economical and efficient in its construction and use, and does not damage the wafer or disc.

SUMMARY OF THE INVENTION

The invention is an optical disc mastering apparatus and process for spin coating an optically active Nitrocellulose Dye Polymer solution onto a transparent Polycarbonate disc substrate and promptly and appropriately curing and drying the spin coated solution in a manner to yield a specified linear ramped optically active lamina that is thicker (approximately 100 Angstroms thicker) on the outer periphery of said disc substrate and thinner at an inner section thereof, such that subsequent recorded data pits on the outer periphery of said disc can be deeper and therefor equally as easy to duplicate in a disc mastering molding process as are less deep data pits at the center of the disc master. The apparatus consists of a disc housing that can be lowered into very accurate close proximity of approximately 2 to 3.5 mm from the active lamina of the disc substrate. The disc housing is cylindrical in form with three concentric and parallel plates serving as a leveling platform mounted on the closed top of the cylinder. Each pair of plates has mounted therebetween a pair of bearings mounted in a plane orthogonal to a pair of adjusting screws that allow orientation of the housing in a virtual infinite number of planes nearly parallel to the disc substrate. A porous, sintered Polypropylene filter is extended across the open bottom of the housing. Clean, dry and warmed Nitrogen gas is forced into the housing chamber formed by the cylinder housing and filter. Buildup of gas pressure forces the Nitrogen through the filter and over the Nitrocellulose Dye Polymer solution in a smooth and even flow causing the solution to cure and dry. The desired ramp is achieved by bending the filter in a convex (or concave if desired) manner by an adjusting set screw centrally positioned in the filter and secured to the interior of the housing. Shaping the filter in such manner can form a gap between the filter and disc substrate of 2 mm at the disc center and 3.5 mm at periphery thereof. The smaller gap at the center tends to cause the solution to dry more quickly and therefor yielding a thinner active lamina. Correspondingly, the larger gap at the disc periphery causes a slower drying and solidification of the active lamina and therefor tends to accumulate a thicker lamina. The ramp between the thinner layer at the disc center to the thicker layer at the disc periphery tends to be linear as desired.

OBJECT OF THE INVENTION

It is a primary object of the invention to increase the yield of molding outputs in disc mastering processes.

It is therefor a directly related object to form a linear ramped optically active layer on a disc substrate in the spin coating and drying process of a disc mastering system that yields a thicker optically active layer on the outer periphery of the disc substrate than at the center thereof, thereby enabling deeper and easier to mold data pits to be recorded on the disc outer periphery, yielding a disc master that is nearly as easy to mold at the exterior thereof as well as at the interior for a higher yield in mass production of discs duplicates.

It is therefor an object of the invention to make a disc substrate drying cover that can be placed over a disc substrate that has been spin coated with an optically active solution, such that a porous air filter of the cover can be adjusted as desired to a variable distance from the disc substrate.

It is still another object of the invention to force clean, dry and heated Nitrogen gas into the interior chamber of the housing to accumulate and be evenly forced under pressure through the porous filter and onto the active solution on the disc substrate to assist in the curing and drying process of the active solution.

It is an ultimate object to utilize the curved and ramped shape of the filter incombination with the variable and heated Nitrogen flow to yield a ramped active lamina on the disc substrate, that in turn will increase disc mastering molding yields.

DETAILED DESCRIPTION OF A PREFERRED EMBODIMENT

Figure 1:
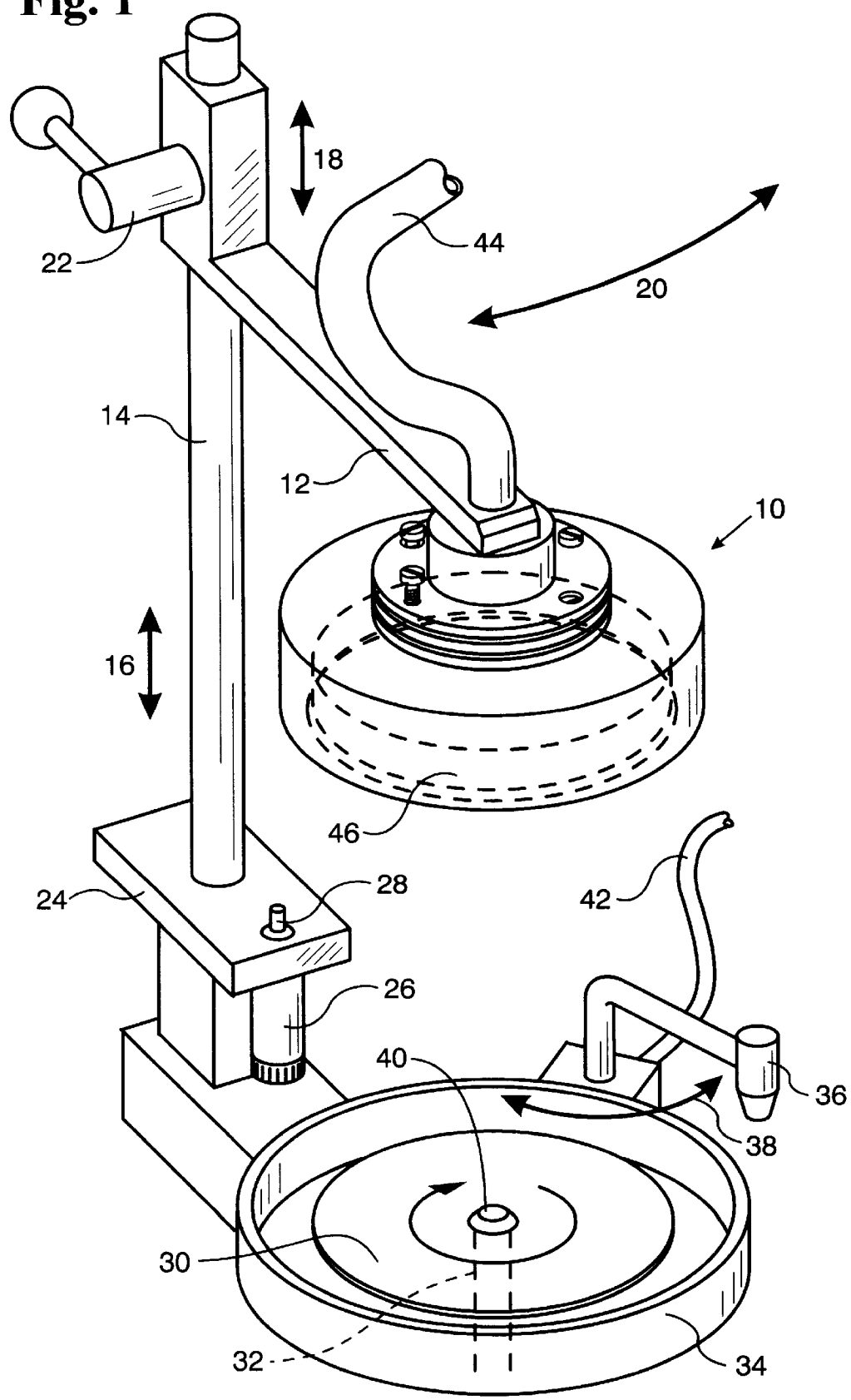
FIG. 1 illustrates a perspective view of the spin coating environment of an optical disc mastering system in which the invention drying cover is applied.

Referring now to FIG. 1, the invention disc drying cover 10 is depicted pictoraly in the general environment in which it is applied. Cover 10 is attached to a horizontal support, traveling arm 12 that can travel up and down a vertical support staff 14 as indicated by arrows 16 and 18. Arm 12 may also be rotated horizontally along staff 14 as indicated by arrow 20 to conveniently move cover 10 up and out of the way of the spin coating process. A locking mechanism 22 secures cover 10 in any appropriate and convenient position as desired along staff 14 until support arm 12 reaches a base platform 24. A vernier, micro adjustment 26 can be turned to propel a positioning rod 28 against arm 12 to accurately set cover 10 a specific distance above a spinning disc substrate 30 attached to a spindle 32 and enclosed in a spin coating drum 34. A spin coating dispenser 36 is configured to move horizontally as indicated by arrow 38 to deposit a specified amount of an optically active solution, which in the preferred embodiment is a Nitrocellulose Dye Polymer, in the center 40 of spinning disc 30. Once the optically active solution, supplied by a solution tube 42, is fully dispensed in the conventional spin coating process over disc substrate 30, dispenser 36 is swung out and off disc 30 and arm 12 is allowed to be lowered along vertical staff 14 to lower and set cover 10 immediately above disc 30. Once cover 10 is set over spinning disc substrate 30, clean, dry and warmed Nitrogen gas supplied through a gas tube 44 is passed into a housing chamber 46 (indicated by hidden lines) of cover 10 and over spinning disc substrate 30 to dry the recently deposited active layer.

Figure 2:
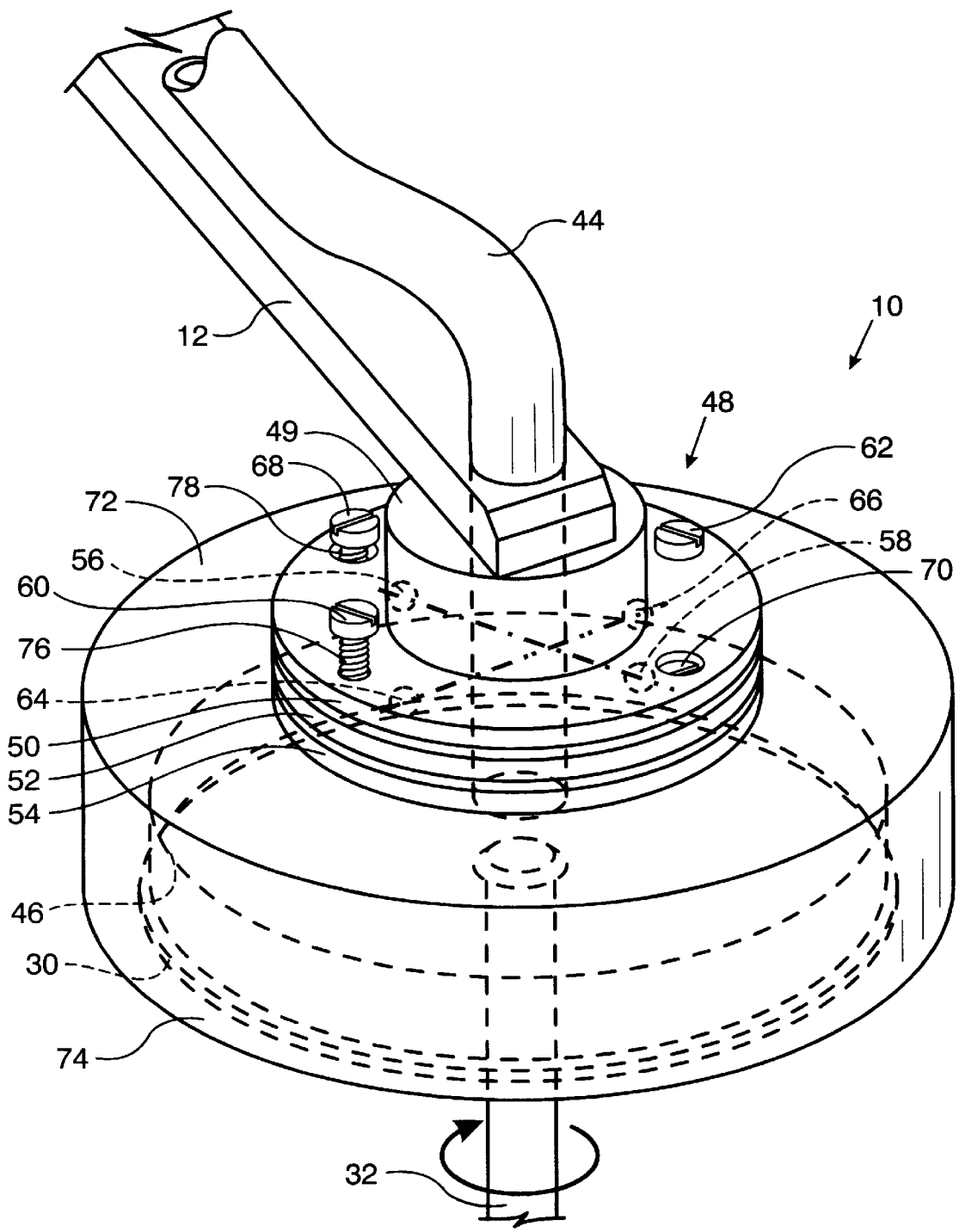
FIG. 2 is a transparent perspective view of the invention disc drying cover delineating in particular functioning of the housing orientation platform.

Referring now to FIG. 2, where a transparent perspective view of the invention cover 10 is illustrated, a clear view of the orientation platform 48 is delineated. Platform 48 consist a top 50, central 52 and bottom 54 parallel and concentric leveling plates. Platform 48 is attached to arm 12 by a by a hollow spacing cylinder 49. A first pair of bearings 56 and 58 are positioned between top plate 50 and central plate 52 in a plane orthogonal to the plane of a first pair of adjusting screws 60 and 62. A second pair of bearings 64 and 66 likewise are positioned between central plate 52 and bottom plate 54 in a plane orthogonal to the plane of a second pair of adjusting screws 68 and 70. Adjusting screws 60 and 68 are provided with stabilizing springs 76 and 78, respectively. Orientation platform 48 is securely affixed to tho top 72 of a cylindrical disc housing 74 of cover 10. It can be observed in FIG. 2 that as screw 60 is adjusted up or down, top plate 50 will incline and bend around first bearings 56 and 58 causing attached housing 72 to likewise follow in the tilt. So too, it can be observed that as screw 68 is adjusted up or down, central plate 52 will tilt over second bearings 64 and 66 to cause housing 74 to again tilt in a plane orthogonal to the tilt plane of screw 60. By adjusting screws 68 and 60, it can be observed that housing 74 can correspondingly be tilted in an infinite numbers of planes about the horizontal to accurately set housing 74 immediately above and parallel to spinning disc 30.

Figure 3:
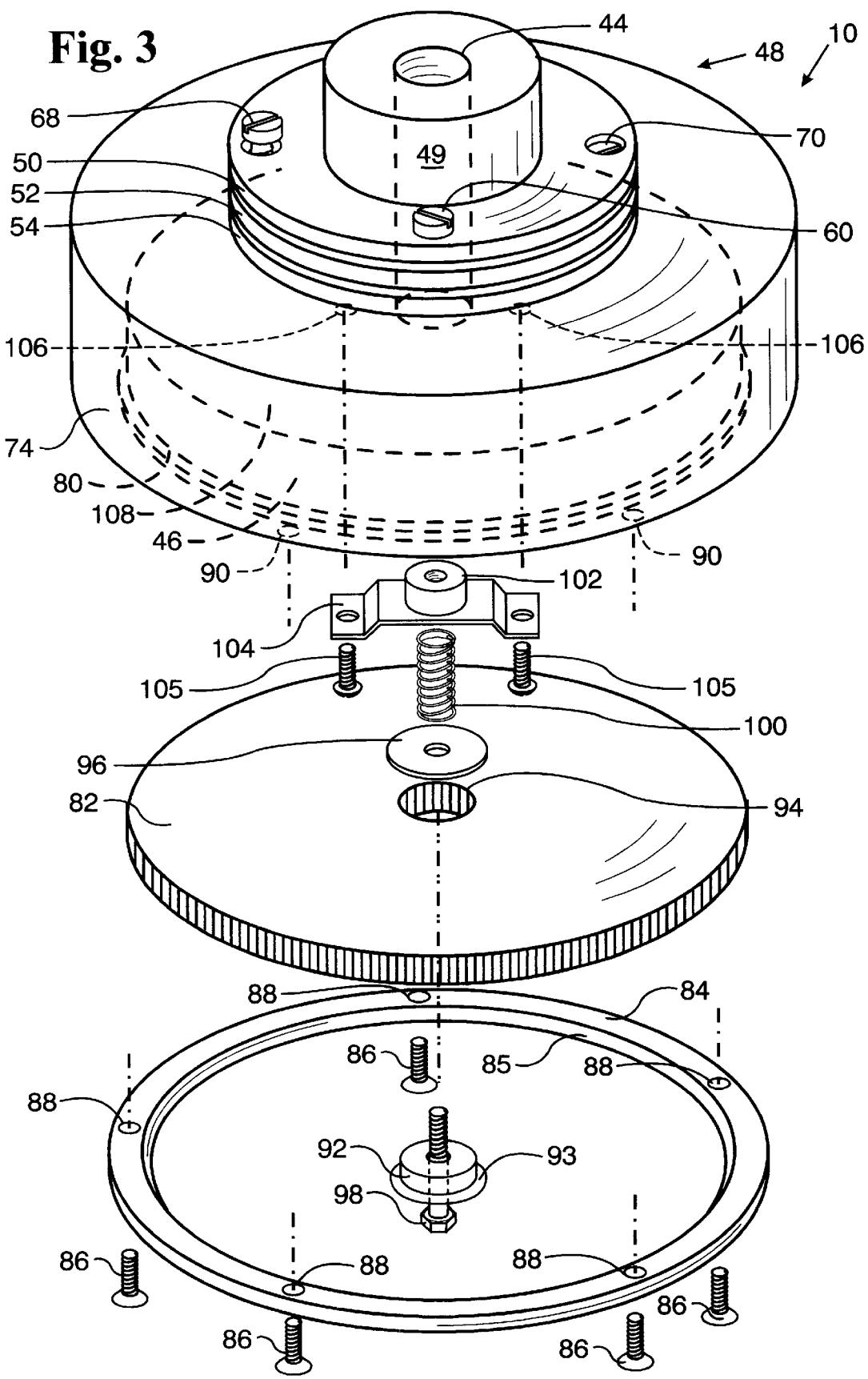
FIG. 3 is an exploded perspective of the invention disc cover delineating the porous filter and integral components thereof.

Moving now to the exploded perspective view of FIG. 3, a more detailed description of drying cover 10 will be delineated. In FIG. 3, housing 74 is again depicted with orientation platform 48 coupling housing 74 to traveling arm 12 with gas inlet tube 44 passing therethrough into housing chamber 46 again indicated by hidden lines. Housing 74 is provided with an indented shelf 80 around the peripheral bottom thereof for receipt of a gas filter 82 therein. Filter 82 in the preferred embodiment is a porous sintered polyproplylene disc, although not necessarily limited thereto, of a larger diameter than spin coated disc 30. Filter 82 is held fast in position within shelf 80 by a stainless steel ring 84 with an interior beveled edge 85 connected to housing 74 by a plurality of ring screws 86 passing through ring screw holes 88 into housing screw holes 90. Filter 82 is further connected to housing 74 by a central fastening and filter camber adjusting mechanism consisting of a central filter, inverted insert cup 92 with a beveled edge 93 which is forcefully inserted into a central filter hole 94 and capped with a mounting washer 96. A filter camber adjusting screw 98 is inserted through insert cup 92, through filter hole 94, washer 96 and a restraining spring 100 into a camber adjusting nut 102 attached to a central mounting bar 104. Mounting bar 104 is in turn firmly affixed with a pair of mounting screws 105 to screw holes 106 the ceiling 108 and across gas insert tube 44 of housing chamber 46.

Figure 4:
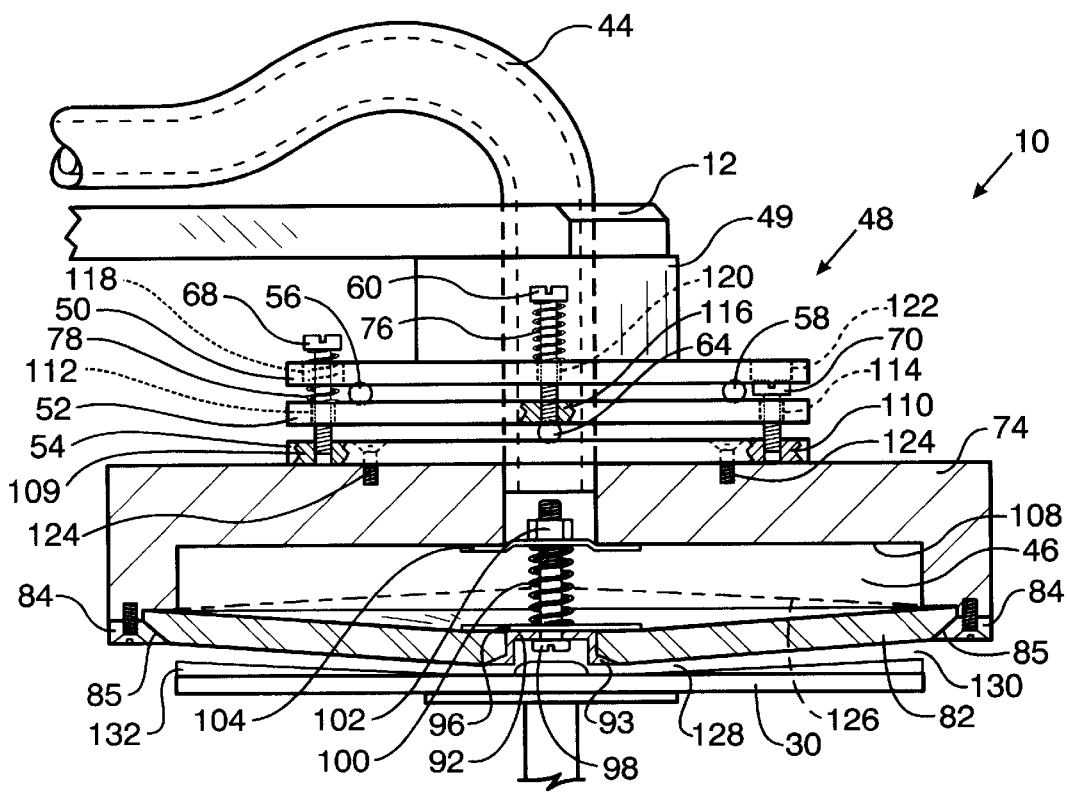
FIG. 4 is an elevational view of one embodiment of the disc drying cover in part cross section indicating the housing chamber, and the porous filter and housing orientation mechanisms.
Figure 5:
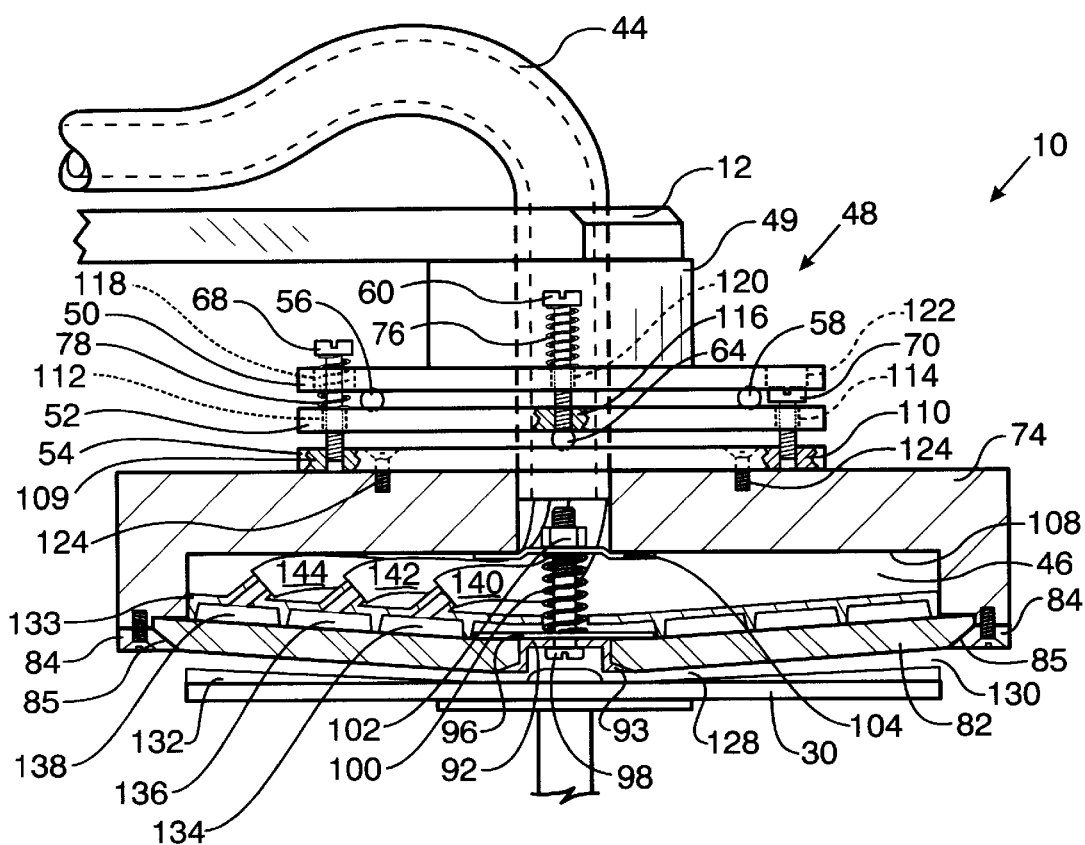
FIG. 5 is an elevational view of an alternate embodiment of the disc drying cover in part cross section, as in FIG. 4, but indicating 3 distinct and independent rings or gas concentration compartments of the housing chamber.

Referring now to FIGS. 4 and 5, elevational views of spin disc cover 10 are depicted as identical drawings with the very noteworthy exception that housing chamber 46 in FIG. 5 is substantially altered from that of FIG. 4. Virtually all elements of the invention have been covered in FIGS. 1, 2 and 3 and will not necessarily be addressed further; however, the partial cross section elevational views of FIGS. 4 and 5 more clearly illustrate the unique function and operation of orientation platform 48 and flexible porous filter 82. In FIGS. 4 and 5, housing 74 is illustrated in cross section, orientation plate 54 is illustrated with cut away adjusting screw hole sections 108 and 110 depicting the full extension of plate orientation adjusting screws 68 and 70, respectively. Central plate 52 depicts hidden screw passages 112 and 114 for plate orientation adjusting screws 68 and 70, respectively, and further illustrates a cut away section 116 to clearly illustrate the travel of plate adjusting screw 60. Top plate 50 in turn illustrates hidden screw holes 118, 120 and 122 for adjusting screws 68, 60 and 70, respectively. A plurality of platform securing screws 124 indicate that orientation platform 48 is securely attached to, and controls lateral orientation of housing 74. In FIGS. 4 and 5, it can be further observed that by adjusting screw 68 up or down in concert with opposing set screw 70, first plate 50 can be caused to incline about a horizontal plane in a first vertical plane on bearings 64 and 66. Correspondingly, by adjusting screw 60 up and down in concert with opposing set screw 62, second plate 52 can be caused to incline about a horizontal plane in a second vertical plane on bearings 56 and 58.

In addition to gross orientation of housing 74 and attached filter 82 in relation to spinning disc substrate 30, the camber of filter 82 is also adjustable. In FIGS. 4 and 5, filter adjust screw 98 can be moved up and down causing the camber of filter 82 to be convex, as illustrated in FIGS. 4 and 5, or concave, as indicated by the hidden line 126 in FIG. 4. In the preferred embodiment, the convex orientation of FIGS. 4 and 5 is desired in order to set an approximately 2 mm gap 128 at the center of disc substrate 30 and an approximately 3.5 mm gap 130 at the outer periphery of disc 30. By such orientation, warmed Nitrogen gas flowing out of filter 82 and onto an active layer 132, grossly exaggerated in FIGS. 4 and 5 for purposes of illustration, will cause a quickened drying effect at disc 30 center, and a slower drying process at the outer periphery thereof, which in turn will tend to form the desired linear ramp of the optically active lamina 132. It should be pointed out that disc 30 is spinning on and secured to spindle means 32 by suction techniques conventional in the art.

Referring now to FIG. 5 alone, it will be observed that a three ringed compartment gas containment fixture 132 is positioned atop and fixedly secured to filter 82. Fixture 132 consists of an inner 134, central 136 and outer 138, gas containment and distribution rings that are supplied by three independent gas delivery tubes 140, 142 and 144, respectively. By this alternative embodiment, one can vary the gas pressure and correspondingly gas flow rate through filter 82 and subsequently across disc substrate 30. By such means, the ramp of optically active lamina, dashed line 132 of FIGS. 4 and 5, can be more accurately controlled and varied as desired or needed.

I claim:

1. A disc enclosure for drying a spin coated active lamina with a desired linear ramp onto a disc substrate, comprising:
   a disc housing;
   a housing orientation platform coupled to said housing;
   a filter disposed on said housing in close proximity to said disc substrate;
   adjusting means for varying the gap between said filter and said disc substrate; and
   means for dispensing gas into said housing, through said filter and across said disc substrate.

2. A disc enclosure according to claim 1, wherein said housing is cylindrical in form, having a top side and a bottom side, and wherein said top side is closed and said bottom side is open.

3. A disc enclosure according to claim 2, wherein said orientation platform is disposed on said top side of said housing.

4. A disc enclosure according to claim 3, wherein adjustment is made by a pair of spring loaded screws disposed between said plates on at least two planes orthogonal to each other.

5. A disc enclosure according to claim 1, wherein said filter is disc shaped.

6. A disc enclosure according to claim 5, wherein said filter is confined within said housing by a stainless steel ring firmly securing said filter to the periphery of said housing.

7. A disc enclosure according to claim 6, wherein said filter acts to build up gas pressure in said housing and to evenly distribute said gas evenly over said disc substrate.

8. A disc enclosure according to claim 7, wherein said filter is a porous sintered polypropylene filter.

9. A disc enclosure according to claim 1, wherein said adjusting means for varying the gap between said filter and said disc substrate consists of an adjustable hub mounted centrally in said filter in variable communication with said housing.

10. A disc enclosure according to claim 9, wherein said filter variable communication means consists of a spring loaded screw that raises and lowers the central portion of said filter, whereby the periphery of said filter remains fixed, thereby causing said filter to take a concave and convex shape over said disc substrate.

11. A disc enclosure according to claim 1, wherein said gas dispensing means consists of an air tube in communication with and dispensing a gas into said housing, whereby said gas is allowed to build up sufficient pressure in a chamber within said housing defined by said filter and said housing, whereby said gas pressure enables said gas to evenly pass through said filter and down upon said disc substrate.

12. A process for accurately forming a ramped and controlled layer on a spinning disc substrate, comprising the steps of:
    depositing a fixed amount of a solution comprising said layer to be formed at a central portion of said spinning disc substrate;
    placing a drying cover over said spinning disc substrate;
    positioning and adjusting said drying cover to be very close, level and parallel to said disc substrate;
    passing a clean, dry and warmed gas flow from said drying cover smoothly, and evenly over said spinning disc through a filter disc in said drying cover concentric to said disc substrate; and
    varying the gap between said drying cover filter disc by variably bending said filter disc as needed at the center thereof to form a concave and convex filter surface facing said disc substrate, whereby the distance between said filter disc and said disc substrate at the center of said concentric discs is smaller than the distance between said discs at the outer periphery thereof, thereby causing said warmed gas to flow outwardly over said disc substrate faster and under greater pressure at the center of said disc substrate, and slower and with less pressure at the outer periphery thereof, and thereby causing said solution to cure and solidify more quickly and into a thinner layer of approximately 2000 Angstroms at the center of said disc substrate, and causing said solution to cure and solidify more slowly and into a thicker layer of approximately 2100 Angstroms at the outer periphery thereof to yield a desired ramp from the center of said disc substrate to the outer periphery thereof.

13. The process according to claim 12, whereby said solidification yields a ramped optically active lamina.

14. The process according to claim 13, whereby said active lamina is a nitrocellulose dye polymer.

15. The process according to claim 12, whereby said gas in Nitrogen.

16. The process according to claim 15, whereby said Nitrogen is purified to remove all particulate matter greater than 0.1 microns in diameter.

17. The process according to claim 16, whereby said Nitrogen is heated to ambient room temperature of approximately 80 to 90 degrees Fahrenheit.

18. A spin coater drying cover for yielding a controlled and ramped optically active lamina on a disc substrate, comprising:

means for applying an optically active solution to a spinning disc substrate;

means for covering said spinning disc substrate during a curing, drying period to yield a solidified optically active layer;

means for accurately leveling said cover means to set said cover means in a parallel position in close proximity to said disc substrate;

filter means for passing a gas through said cover means and onto said disc substrate in an even, controlled and distributive manner;

means for adjusting said filter means in a manner to vary the distance between said filter means and said disc substrate in such manner to yield a faster curing and solidification of said active solution at a central portion of said disc substrate and a slower solidification at an outer periphery thereof, thereby yielding a thinner active layer near the center of said disc substrate and a thicker layer at the outer periphery thereof to yield a controlled ramped optically active layer.

19. The drying cover according to claim 18, wherein the active solution is a Nitrocellulose Dye Polymer.

20. The drying cover according to claim 18, wherein the gas is Nitrogen cleaned of all particulate matter greater than 0.1 microns, and warmed to ambient room temperature of approximately 80 to 90 degrees Fahrenheit.

* * * * *